United States Patent [19]

Dias

[11] Patent Number: 4,855,690
[45] Date of Patent: Aug. 8, 1989

[54] INTEGRATED CIRCUIT RANDOM NUMBER GENERATOR USING SAMPLED OUTPUT OF VARIABLE FREQUENCY OSCILLATOR

[75] Inventor: Donald R. Dias, Carrollton, Tex.

[73] Assignee: Dallas Semiconductor Corporation, Dallas, Tex.

[21] Appl. No.: 265,732

[22] Filed: Nov. 1, 1988

Related U.S. Application Data

[63] Continuation of Ser. No. 083,583, Aug. 10, 1987, Pat. No. 4,810,975.

[51] Int. Cl.$^4$ .............................................. H03K 3/84
[52] U.S. Cl. .................................... 331/78; 331/47; 331/57; 331/111; 331/178; 364/717
[58] Field of Search ........................... 331/78, 47, 178; 328/59; 364/717

[56] References Cited

U.S. PATENT DOCUMENTS 4,001,817  1/1977  Squires .......................... 331/178 X
4,644,299  2/1987  Amoroso et al. ..................... 331/78

Primary Examiner—Siegfried H. Grimm
Attorney, Agent, or Firm—Worsham, Forsythe, Sampels & Wooldridge

[57] ABSTRACT

An integrated circuit random number generator which uses a triangular output analog oscillator to vary the frequency of a higher frequency voltage controlled oscillator. The output of the voltage controlled oscillator is sampled at a rate much less than the rate of oscillation of the voltage controlled oscillator to produce random digital values.

14 Claims, 2 Drawing Sheets

4,855,690

INTEGRATED CIRCUIT RANDOM NUMBER GENERATOR USING SAMPLED OUTPUT OF VARIABLE FREQUENCY OSCILLATOR

REFERENCE TO RELATED APPLICATION

This is a continuation of application Ser. No. 083,583, filed Aug. 10, 1987, now U.S. Pat. No. 4,810,975.

TECHNICAL FIELD

This invention relates to electronic circuits, and more particularly, to electronic circuits for generating random numbers.

BACKGROUND OF THE INVENTION

It is desirable to generate random numbers or random data for various applications in electronic circuits. One such application is in secure data systems in which a serial stream of random digital bits is generated for creating new encryption keys.

Various methods have been used in the past to generate random numbers. Some of these methods generate essentially true random numbers (for instance, using circuits which amplify the shot noise in a resistor), and some methods produce pseudo-random numbers using computer algorithms. However, with electronic keys, which tend to be small circuit modules having one or two integrated circuits, there is only a small amount of chip area available on which to fabricate a random number generator.

Therefore, it can be appreciated that a random number generator circuit which produces random numbers on a relatively small area of an integrated circuit is highly desirable.

SUMMARY OF THE INVENTION

It is therefore, an object of this invention to produce a random number generator circuit which produces a serial stream of essentially random digital bits and which can be fabricated on a relatively small area of an integrated circuit chip.

Shown in an illustrated embodiment is a circuit for generating random numbers, which includes a first voltage generator for generating a time-varying voltage at a first node. A variable frequency oscillator generates an oscillation signal at a frequency determined by the voltage at the first node. A sampling circuit samples the output of the oscillator, at a rate which is independent of the oscillation frequency of the first voltage generator and the frequency of the digital oscillator. The output of the sampling circuit is a digital signal.

Also shown in an illustrated embodiment is a method for generating random numbers in which a time-varying voltage is generated. A variable-frequency oscillating signal is also generated, the frequency of the variable-frequency oscillating signal being controlled by the time-varying voltage. The variable frequency oscillating signal is sampled at a rate independent of the time-varying voltage and independent of the variable-frequency oscillating signal.

BRIEF DESCRIPTION OF THE DRAWINGS

The aforementioned and other features, characteristics, advantages, and the invention in general will be better understood from the following, more detailed description taken in conjunction with the accompanying drawings in which.

Figure 1:
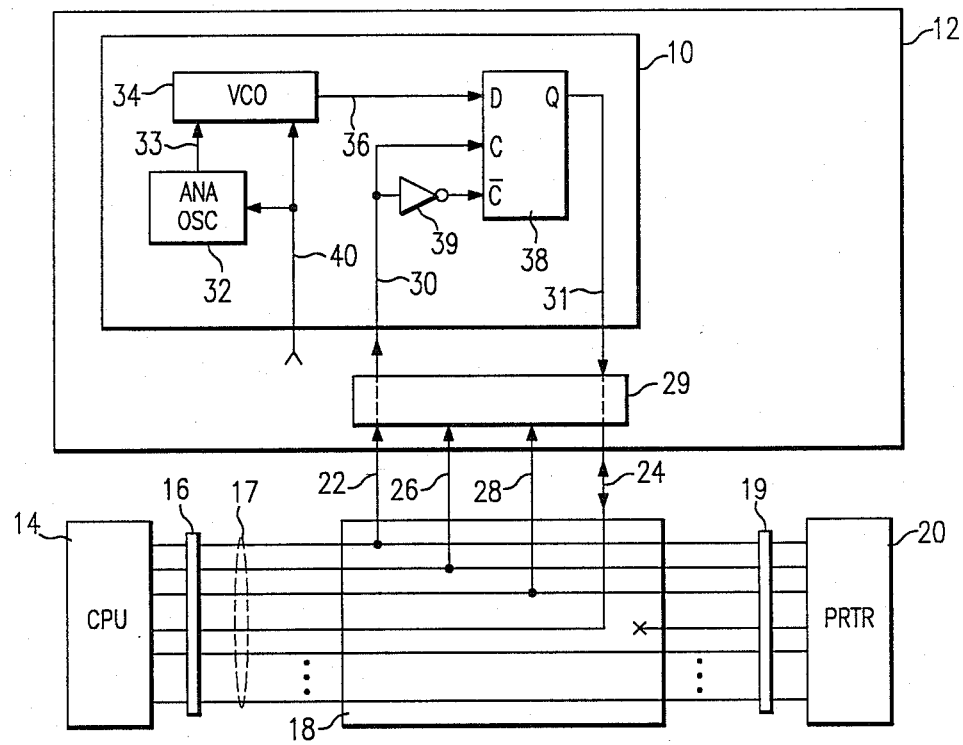
FIG. 1 is a block diagram of an electronic key system including a random number generator circuit according to the present invention.

It will be appreciated that for purposes of clarity and where deemed appropriate, reference numerals have been repeated in the figures to indicate corresponding features.

DESCRIPTION OF THE PREFERRED EMBODIMENT

The random number generator of the present invention may advantageously be used in an electronic key system. A block diagram of a particular electronic key system containing a random number generator according to the present invention is shown in FIG. 1. The random number generator is shown as block 10 and is contained within an electronic key 12. Also shown in FIG. 1 is a central processing unit (CPU) 14 which has connected to it a parallel port connecter 16 through which passes a plurality of data lines and other signal lines 17. Connected to the parallel port connecter 16 is an interface circuit or key ring 18. Connected to the output of the key ring 18 is another parallel port connector 19 which in turn can be connected to printer 20. Connected between the key ring 18 and the electronic key 12 are four lines: a clock line 22, a data line 24, a reset (complemented) line 26, and a ground line 28. These four lines 22-28 are connected to an interface circuit 29 within the electronic key 12. The interface circuit 29 directs the four signals appearing on lines 22-28 to different portions of the electronic key 12. The random number generator 10 utilizes the clock signal line 30 out of the interface circuit 29, which is the same signal as on the line 22 during the generation of random numbers. The data line 24 is coupled to the data signal line 31 during the generation of random numbers. The connection of ground line 28 will be discussed in detail below.

In the preferred embodiment, the data lines and other signals contained within the parallel port connector 16 out of the CPU 14 are passed directly to the printer 20 with the exception of the SLCTIN signal in the parallel port connector 16 which is used to provide data to and from the electronic key 12 on line 24. Since the SLCTIN signal is not used by peripheral printers, the key ring 18 directs this SLCTIN signal directly to line 24 leading into the electronic key 12 and disconnects the SLCTIN signal line from the peripheral device 20.

The other three lines, the clock line signal on line 22, the reset (complemented) signal on line 26 and the ground signal on line 28, are tapped off lines which are connected between the CPU 14 and the printer 20. The clock signal in the preferred embodiment is connected to the data out 3 (D3) line, and the reset (complemented) on line 26 is tapped off the data out 2 (D2) line. The ground connection is the ground line running in the parallel port connector 16.

Although not shown in FIG. 1 nor discussed in detail for the sake of brevity, it will be understood that the electronic key ring 18 can be suitably modified by means known to those skilled in the art for use in virtually any communications path such as the communications path between the CPU 14 and a nonvolatile memory device, for example a ROM, inside of the CPU 14; or attached to an RS232 serial port. In at least some of these configurations the electronic key ring 18 would require an additional predetermined serial bit stream from the CPU 14 to signal the electronic key ring 18 to route certain signal lines to circuitry embodied within the electronic key 10 rather than through the normal communication channel.

With reference again to FIG. 1, when the CPU 14 wishes to read from or write to the electronic key 12, the CPU 14 provides a serial bit stream of 24 protocol bits to the data line 24 to activate the key and to indicate to the electronic key 12 to either receive data or to write data back to the CPU 14. The protocol bits are clocked into and out of the electronic key 12 by the CPU 14 which provides a clock signal on the line 22 (which is the D3 line of the parallel port connector 16). Additional bits described hereafter—including identification bits, password bits, and data bits—are likewise clocked into and out of the CPU 14 by the clock signal on the line 22. Prior to this transmission of the 24 bits of protocol, the reset (complements) line 26 must be first held low and then raised to a logic 1 position to reset the electronic key 12 and to also provide power to the electronic key 12. Thus, the reset (complemented) line 26 must be held high during the entire data transfer procedure.

Once the 24 bits of protocol have been received by the electronic key 12 the electronic key 12 returns 64 bits of an identification code which are passed back to the CPU 14 on line 24.

Following the transfer of this 64 bits of identification data from the key, then, if the CPU 14 decides to continue the data exchange, a password or access code of an additional 64 bits is sent by the CPU 14 to the electronic key 12. If the password is not correct, then the electronic key 12 returns 128 bits of random data to the CPU 14 if the protocol request was for the electronic key 12 to transfer data to the CPU 14. If the password is not correct and the protocol request was to write data from the CPU 14 to the electronic key 12, then the data from the CPU 14 will be ignored. If the password is correct, then the electronic key 12 will either send 128 bits of data to the CPU 14 or receive 128 bits of data from the CPU 14 depending on the exact configuration of the 24 protocol bits.

Thus the electronic key 12 shown in FIG. 1 is able, first, to recognize a protocol command from a CPU 14; secondly, to provide an identification of the key to the CPU 14 for verification by the CPU 14 software that a valid key is attached to the CPU 14; thirdly, to accept and verify a password from the CPU 14; fourthly, to return random data or to ignore data sent from the CPU 14 if the password is incorrect; and finally, if the password is correct, to return secure data from the key to the CPU 14, which the PCU 14 may use in different ways, or to receive secure data from the CPU 14.

In order for the full security offered by the use of random data to be realized, the software in the CPU needs to issue a plurality of false passwords to the electronic key 12 with a read request protocol so that an authentic request will be only one of several requests. Also the random number generation feature of the electronic key 12 may be used to provide random numbers for the software for uses unrelated to data security.

Turning to the random number generator block diagram 10 shown in FIG. 1, an anlog oscillator 32 provides a time varying voltage on line 33 to the input of a voltage controlled oscillator (VCO) 34 to thus modulate the frequency of the oscillator 34. The digital output of the VCO 34 on line 36 is connected to the D input of a D latch 38. The clock (C) input to the D latch 38 is connected to the clock line 30 which is inverted by an inverter 39 to produce the clock bar (C bar) input to the D latch 38. The Q output of the D latch 38 is connected to line 31 which is selectively coupled to the data line 24 through the interface circuit 29. Also shown in block 10 is an enable (complemented) line 40 which is used to enable or disable the random number generator of block 10.

In operation, when the random number generator is required to provide random numbers, the electronic key 12 places an enable (complemented) signal on line 40 to enable both the analog oscillator 32 and the VCO 34. When enabled, the analog oscillator provides a triangular waveform at its output 33 which then modulates VCO 34 frequency so that it alternately ramps from its highest frequency to its lowest frequency and back to its highest frequency in accordance with the output from the analog oscillator 32. This frequency varying signal at the output of the VCO 34 on line 36 is then coupled into the D input of the D latch 38 where it is sampled by the clock signal from line 30 which in turn is provided by the CPU 14. Following each sample, the data at the Q output of the D latch 38 is coupled through line 31 to the data line 24 and back to the CPU 14.

Figure 3:
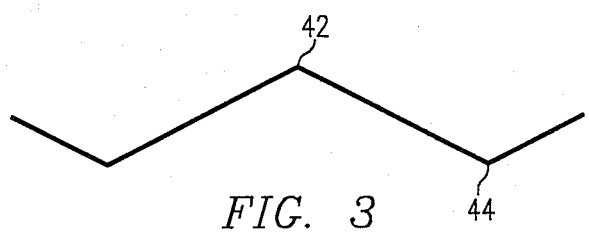
FIG. 3 is a waveform of the voltage out of the analog oscillator of FIG. 1.
Figure 4A:
FIG. 4 is the waveform of the voltage out of the VCO of FIG. 1.
Figure 4B:

The output of the analog oscillator 32 appearing on line 33 in the preferred embodiment is shown in FIG. 3. As can be seen in FIG. 3 the output on line 33 is a triangular waveform. FIG. 4A and 4B is the output of the VCO 34 which appears on line 36. FIG. 4A is an output of the oscillator 34 when it is at its highest frequency which is produced when the output of the analog oscillator 32 on line 33 is the most positive as shown as point 42 in FIG. 3. Conversely FIG. 4B shows the output of the VCO 34 appearing on line 36 when the oscillator frequency is at its lowest, which corresponds to the lowest voltage from the analog oscillator 32 shown as point 44 in FIG. 3. In the preferred embodiment the frequency of the VCO 34 varies between 40 MHz and 80 MHz. Thus the waveform shown in FIG. 4A represents an 80 MHz oscillation out of the VCO 34. As shown in FIG. 4A, at this 80 MHz frequency the VCO provides an approximate sinusoidal waveform and is the approximate upper frequency limit of the VCO generated by the circuit shown in FIG. 2 with the present day technology. FIG. 4B shows the output of the VCO 34 at its lowest frequency of 40 MHz in the preferred embodiment. At this frequency the signal looks much more like a digital waveform. In the preferred embodiment the analog oscillator frequency is approximately 128 KHz.

The frequencies disclosed above are selected and based, in part, on the clock frequency which will be produced by the CPU 14. For such CPUs as, for example, an IBM PC AT, the average clock frequency produced by the data transfer method described above is approximately 500 KHz. Thus the time required to transfer 128 bits of serial data is approximately 256 microseconds. However, the VCO 34 is operating at a much greater frequency; thus the polarity of the signal generated at the Q output of the D latch 38 will be essentially random, since the output frequency of the VCO 34 will be varying continuously over the time required to transfer 128 bits of data from the D latch 38 and since the CPU clock is independent of the VCO 34. Moreover, the clock generated by the CPU 14 is not necessarily regular. While the CPU 14 generally has a crystal based internal oscillator, the CPU 14 itself may have interrupts and other functions which it performs during the data transfer process, thereby distributing the time intervals between successive clock pulses.

Figure 2:
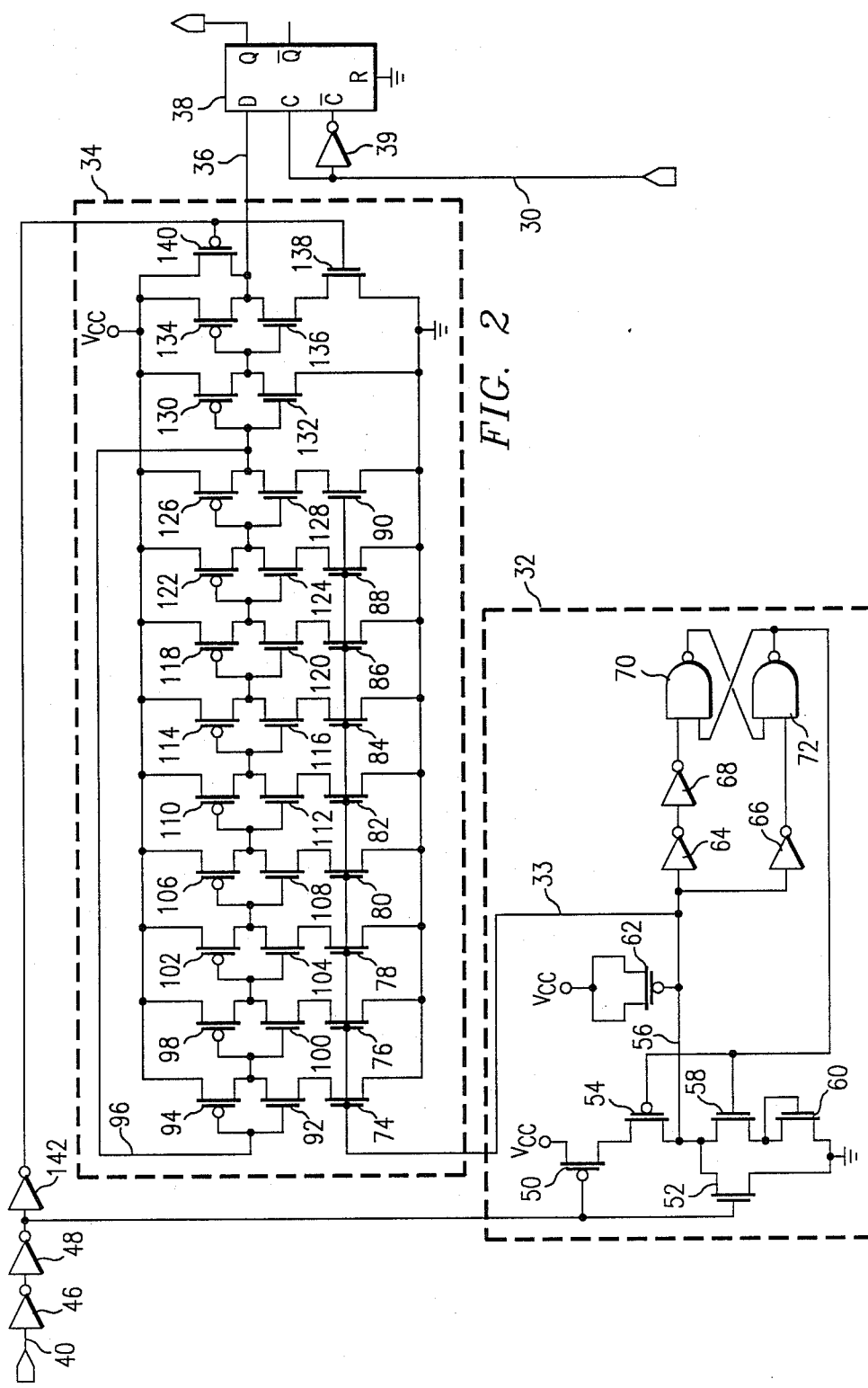
FIG. 2 is a schematic diagram of the random number generator circuit of FIG. 1.

Turning now to FIG. 2, a detailed schematic diagram is shown for the analog oscillator 32 and the VCO 34. As shown in FIG. 2 the oscillator enable (complemented) signal on line 40 is inverted twice by a pair of series inverters 46 and 48. The output of the inverter 48 is connected to the gates of a P-channel transistor 50 and of an N-channel transistor 52, which are parts of the analog oscillator circuit 32. The source of transistor 50 is connected to the power supply voltage VCC, which typically is at +5.0 volts, and the drain of transistor 50 is connected to the source of another P-channel transistor 54. The drain of the transistor 54 is connected to an internal node 56 and to the drain of the transistor 52 and to the drain of another N-channel transistor 58. The source of the transistor 58 is connected to the gate and drain of another N-channel transistor 60, the source of which is connected to ground. The source of the transistor 52 is also connected to ground. The node 56 is connected to the gate of another P-channel transistor 62, the source and drain of which are connected together and to VCC (thus forming a capacitor between VCC and node 56). The node 56 is also connected to the input of two inverters, a first inverter 64 and a second inverter 66. The output of the inverter 64 is connected to the input of another inverter 68, and the output of the inverter 68 is connected to a first input of a NAND gate 70. The output of the inverter 66 is connected to a first input of a NAND gate 72. The output of the NAND gate 72 is connected to the second input of the NAND gate 70, and the output of the NAND gate 70 is connected to the second input of the NAND gate 72, thereby forming an R-S flip-flop. The output of the NAND gate 72 is also connected to the gates of the transistors 54 and 58. The node 56 is also connected to the output line 33 of the analog oscillator circuit 32.

Turning now to the detailed circuitry for the VCO 34 also shown in FIG. 2, the output from the analog oscillator on line 33 is connected to the gates of nine N-channel transistors 74, 76, 78, 80 82, 84, 86, 88, and 90. The sources of the transistors 74–90 are connected to ground. Connected to the drain of the transistor 74 is the souce of another N-channel transistor 92. Connected to the drain of the transistor 92 is the drain of a P-channel transistor 94. The source of the P-channel transistor 94 is connected to VCC. The gates of the transistors 92 and 94 are connected to a feedback node 96. The transistors 74, 92 and 94 form the first stage of a nine stage ring oscillator.

The common drain connection of the transistors 92 and 94 is connected to the gates of a P-channel transistor 98 and an N-channel transistor 100, which together with transistor 76, form the second stage of the nine stage ring oscillator. The transistors 98 and 100 are connecte in the same manner as transistors 94 and 92, and the output at the common drain connection of the transistors 98 and 100 is connected to the gates of a P-channel transistor 102 and an N-channel transistor 104.

The transistors 102 and 104 and 78 are connected in the same manner as transistors 94 and 92 and 74, and the output at the common drain connection of the transistors 102 and 104 is connected to the gates of a P-channel transistor 106 and an N-channel transistor 108. Transistors 102, 104, and 78 thus form the third stage of the nine stage ring oscillator.

The transistors 106 and 108 and 80 are connected in the same manner as transistors 94 and 92 and 74, and the output at the common drain connection of the transistors 106 and 108 is connected to the gates of a P-channel transistor 110 and an N-channel transistor 112. Transistors 106, 108, and 180 thus form the fourth statge of the nine stage ring oscillator.

The transistors 110 and 112 and 82 are connected in the same manner as transistors 94 and 92 and 74, and the output at the common drain connection of the transistors 110 and 112 is connected to the gates of a P-channel transistor 114 and an N-channel transistor 116. Transistors 110, 112, and 82 thus form the fifth stage of the nine stage ring oscillator.

The transistors 114 and 116 and 84 are connected in the same manner as transistors 94 and 92 and 74, and the output at the common drain connection of the transistors 114 and 116 is connected to the gates of a P-channel transistor 118 and an N-channel transistor 120. Transistors 114, 116, and 84 thus form the sixth stage of the nine stage ring oscillator.

The transistors 118 and 120 and 86 are connected in the same manner as transistors 94 and 92 and 74, and the output at the common drain connection of the transistors 118 and 120 is connected to the gates of a P-channel transistor 122 and an N-channel transistor 124. Transistors 118, 120, and 86 thus form the seventh stage of the nine stage ring oscillator.

The transistors 122 and 124 and 88 are connected in the same manner as transistors 94 and 92 and 74, and the output at the common draining connection of the transistors 122 and 124 is connected to the gates of a P-channel transistor 126 and an N-channel transistor 128. Transistors 122, 124, and 88 thus form the eighth stage of the nine stage ring oscillator.

The transistors 126 and 128 and 90 are connected in the same manner as transistors 94 and 92 and 74. Transistors 126, 128, and 90 thus form the ninth stage of the nine stage ring oscillator.

The common drain connection of the transistors 126 and 128 is connected to the feedback node 96, and also to the gates of a P-channel transistor 130 and an N-channel transistor 132 which form an inverter. That is, the source of the transistor 130 is connected to VCC, and the source of the transistor 132 is connected to ground. The drains of the transistors 130 and 132 are connected to the gates of another P-channel transistor 134 and an N-channel transistor 136. The source of the P-channel transistor 134 is connected to VCC and the source of the transistor 136 is connected to the drain of another N-channel transistor 138, the source of which is connected to ground. The drains of the transistors 134 and 136 are connected to the drain of P-channel transistor 140, the source of which is connected to VCC. The gates of the transistors 138 and 140 are connected to the output of an inverter 142, the input of which is connected to the output of the inverter 48. The common drain connection of the transistors 134, 136, and 140 is connected to the output line 36 of the VCO 34. As shown in both FIG. 1 and FIG. 2, the output line 36 is connected to the D input of the D latch 38

Each of the transistors illustrated in FIG. 2 is of the enhancement mode type; and the magnitude of the threshold voltage for each of the transistors is typically approximately 1.0 volt.

The operation of the analog oscillator 32 is next described with reference to the detailed circuit shown in FIG. 2. When the oscillator enable (complemented) signal on line 40 is low) (a logic 0 level), then the voltage on the gates of the transistors 52 and 50 will be near ground which will enable or make conductive the P-channel transistor 50 but disable, or make nonconductive, the N-channel transistor 52. If the logic level at the output of the NAND gate 72 is high (a logic 1 level at that time, then transistor 58 will be enabled which will in turn tend to discharge the node 56 towards ground at a rate determined by the drain current characteristics of the transistors 58 and 60 and the capacitance of the transistor 62. As used herein the term "low logic level" or "logic 0 level" means a logic level having a voltage near ground, and the term "high logic level" or "logic 1 level" means a logic level having a voltage near VCC. The high logic level at the output of the NAND 72 will disable the transistor 54, thus isolating node 56 from VCC. Conversely if the output of the NAND gat 72 is at a logic 0 level, near ground, then the transistor 54 will be enabled and transistor 58 will be disabled and the node 56 will be charged toward VCC at a rate determined by the drain current characteristics of the transistors 50 and 54 and the size of the capacitor formed by the transistor 62.

If for example, the output of the NAND gate 72 is at a logic 0 level, then the node 56 will begin charging toward VCC until the threshold or trip point of the inverter 66 is reached, at which point the output of the inverter 66 will become a low logic level to thereby force the output of the NAND gate 72 to a high logic level. The high logic level at the output of the NAND gate 72 will then disable the transistor 54 but enable the transistor 58 to thereby cause the node 56 to begin to discharge toward ground. This discharge will continue until the voltage at the input of the inverter 64 reaches its trip point at which time the output of the inverter 64 will go to a high logic level and the output of the inverter 68 will go to a low logic level thereby forcing the output of the NAND gate 70 to a high logic level. Advantageously, the trip points of the inverters 64 and 66 are not at the same voltage, but rather the trip point for the inverter 66 is approximately +4 volts and the trip point for the inverter 64 is approximately +2 volts.

Consequently, when the node 56 begins to discharge to ground the output of the inverter 66 will switch to a high logic level before the output of the inverter 64 switches. Thus, when the output of the NAND gate 70 switches to the high logic level (which will occur after the output of the inverter 64 switches) both inputs to the NAND gate 72 will be at a logic 1 level and the output of the NAND gate 72 will switch to a logic 0 level. At this point, transistor 54 will be enabled and transistor 58 will be disabled thereby tending to charge node 56 to VCC. As the voltage on node 56 increases above 2 volts, then the inverter 64 will switch and its output will go to a logic low level thereby forcing the output of the inverter 68 to a logic high level. The voltage on the node 56 will continue to increase until it reaches the trip point of the inverter 66, about +4 volts in the preferred embodiment, at which time the output of the inverter 66 will switch to a logic 0 level, causing the output of the NAND gate 72 to switch to a logic 1 level and to thereby repeat the cycle. Thus, the voltage at the node 56 in the preferred embodiment switches between +2 volts and +4 volts, and since the conducting transistors 54 and 58 each operate in essentially a constant current condition, the voltage at the node 56 will be the triangular waveform shown in FIG. 3.

This triangular waveform at the output of the analog ocillator 32 appearing on line 33 is used to vary the conductivity of the lower N-channel transistors on each of the nine stages of the ring oscillator in the VCO 34. As the lower N-channel transistors 74–90 become more conductive, the switching speeds of each of the individual stages of the ring oscillator increases, thereby causing the frequency of oscillation of the ring oscillator to increase. Conversely, as the voltage on line 33 and on the gates of the transistors 74–90 decreases the oscillator frequency is caused to decrease.

The inverter stage consisting of the transistors 130 and 132 serves to amplify and square up the output of the ring oscillator. A second buffer stage consisting of transistors 134 and 136 also performs this function. The transistors 138 and 140 operate to disable the output of the VCO 34 when the enable (complemented) line 40 is at a logic 1 level. Under this condition the gates of the transistors 138 and 140 will be held low which will cause the transistor 140 to be conductive and cause the transistor 136 to be nonconductive, thereby causing the voltage on line 36 to be held to VCC. When the enable (complemented) line 40 voltage is at a logic 0, though, the voltage on the gates of the transistors 138 and 140 will be at a logic 1 which will cause the transistor 138 to be conductive and the transistor 140 to be nonconductive, thereby allowing the transistors 134 and 136 to operate as an inverter.

The D latch 38 is edge triggered. The logic level at the D input at the time of the rising edge of the clock line 30 is passed to the Q output, and the Q output will remain at that level until the next rising edge of the clock line 30. The D latch 38 is well known in the art and is not shown here in detail for the sake of brevity.

In accordance with the foregoing, there has been described a random number generator which produces essentially random numbers and yet that can be fabricated on a relatively small area of an integrated circuit.

Although the invention has been described in part by making detailed reference to a certain specific embodiment, such details are intended to be, and will be understood to be, instructional rather than restrictive. It will be appreciated by those of ordinary skill in the art that many variations can be made in the structure and mode of operation without departing from the spirit and scope of the invention, as disclosed in the teachings contained herein. For example, other types of voltage controlled oscillators may be used in place of the ring oscillator of the preferred embodiment. Also, other types of analog voltages may be used to control the frequency of the VCO; for example, it is not necessary that the analog voltage have an oscillating or repetitive waveform—it can be any type of time varying voltage generated by a voltage generator.

What is claimed is:

1. An integrated circuit random number generator, comprising:
   an analog oscillator;
   a digital oscillator,
      comprising multiple digital stages connected together,
      multiple ones of said stages being connected to be controlled by the output voltage of said analog oscillator; and a sampling circuit, connected to sample the output of said digital oscillator with a timing which is independent of the operation of said digital oscillator;

wherein the highest frequency of said analog oscillator is less than the lowest frequency of said digital oscillator.

2. The integrated circuit of claim 1, wherein the highest frequency of said analog oscillator is much less than the lowest frequency of said digital oscillator.

3. The integrated circuit of claim 1, wherein said analog oscillator is free-running.

4. The integrated circuit of claim 1, wherein the lowest frequency of said digital oscillator is at least 40 MHz.

5. The integrated circuit of claim 1, wherein the range of frequencies of said digital oscillator includes 80 MHz.

6. An integrated circuit random number generator, comprising:
   a free-running analog voltage generator circuit;
   a ring oscillator, multiple stages of said ring oscillator being conneted to be controlled by the output voltage of said analog voltage generator circuit; and
   a sampling circuit, connected to sample the output of said ring oscillator with a timing which is independent of the operation of said ring oscillator;
   wherein the highest frequency of said analog voltage generator circuit is less than the lowest frequency of said ring oscillator.

7. The integrated circuit of claim 6, wherein the lowest frequency of said ring oscillator is at least 40 MHz.

8. The integrated circuit of claim 6, wherein the range of frequencies of said ring oscillator includes 80 MHz.

9. The integrated circuit of claim 6, wherein the highest frequency of said analog voltage generator circuit is much less than the lowest frequency of said ring oscillator.

10. An integrated circuit random number generator, comprising:
    a capacitively loaded analog oscillator;
    a ring oscillator comprising multiple inverter stages, multiple respective ones of said inverter stages being connected in series with load transistors which are controlled by the output voltage of said analog oscillator; and
    a sampling circuit, connected to sample the output of said ring oscillator with a timing which is independent of the operation of said ring oscillator;
    wherein the highest frequency of said analog oscillator is less than the lowest frequency of said ring oscillator.

11. The integrated circuit of claim 10, wherein the highest frequency of said analog oscillator is much less than the lowest frequency of said ring oscillator.

12. The integrated circuit of claim 10, wherein said analog oscillator is free-running.

13. The integrated circuit of claim 10, wherein the lowest frequency of said ring oscillator is at least 40 MHz.

14. The integrated circuit of claim 10, wherein the range of frequencies of said ring oscillator includes 80 MHz.

* * * * *